(12) United States Patent
Roche et al.

(10) Patent No.: US 7,535,743 B2
(45) Date of Patent: May 19, 2009

(54) SRAM MEMORY CELL PROTECTED AGAINST CURRENT OR VOLTAGE SPIKES

(75) Inventors: Philippe Roche, Le Versoud (FR); François Jacquet, Froges (FR)

(73) Assignee: STMicroelectronics S.A., Montrouge (FR)

( * ) Notice: Subject to any disclaimer, the term of this patent is extended or adjusted under 35 U.S.C. 154(b) by 177 days.

(21) Appl. No.: 11/225,876

(22) Filed: Sep. 12, 2005

(65) Prior Publication Data

US 2006/0056220 A1 Mar. 16, 2006

(30) Foreign Application Priority Data

Sep. 15, 2004 (FR) .................................. 04 09781

(51) Int. Cl.
*G11C 5/06* (2006.01)
(52) U.S. Cl. ............................. 365/63; 365/51; 365/154
(58) Field of Classification Search .................... 365/63, 365/154, 51
See application file for complete search history.

(56) References Cited

U.S. PATENT DOCUMENTS 5,570,313 A * 10/1996 Masson et al. .............. 365/174
6,208,554 B1 3/2001 Phan et al.
6,643,167 B2 * 11/2003 Nii .............................. 365/154
6,909,135 B2 * 6/2005 Nii et al. ..................... 257/297
2003/0112653 A1 6/2003 Nii
2004/0227094 A1 * 11/2004 Tompa et al. .......... 250/370.01

FOREIGN PATENT DOCUMENTS

EP 0 623 932 11/1994

OTHER PUBLICATIONS

Preliminary French Search Report, FR 04 09781, dated May 30, 2005.

* cited by examiner

*Primary Examiner*—Huan Hoang
*Assistant Examiner*—Kretelia Graham
(74) *Attorney, Agent, or Firm*—Gardere Wynne Sewell LLP

(57) ABSTRACT

A memory cell is protected against current or voltage spikes. The cell includes a group of redundant data storage nodes for the storage of information in at least one pair of complementary nodes. The cell further includes circuitry for restoring information to its initial state following a current or voltage spike which modifies the information in one of the nodes of the pair using the information stored in the other node. The data storage nodes of each pair in the cell are implanted on opposite sides of an opposite conductivity type well from one another within a region of a substrate defining the boundaries of the memory cell.

18 Claims, 2 Drawing Sheets

(12) United States Patent

SRAM MEMORY CELL PROTECTED AGAINST CURRENT OR VOLTAGE SPIKES

PRIORITY CLAIM

The present application claims priority from French Application for Patent No. 04 09781 filed Sep. 15, 2004, the disclosure of which is hereby incorporated by reference.

BACKGROUND OF THE INVENTION

1. Technical Field of the Invention

The present invention relates to memory cells protected against current or voltage spikes, in particular SRAM memory cells.

2. Description of Related Art

The continuing progressive miniaturization of electronic circuits allows smaller and smaller circuits having an increasingly higher performance to be obtained. On the other hand, these circuits are more and more sensitive to their external environment, and in particular to spurious logic events caused by an input of energy originating from outside of the circuit.

A spurious logic event is a localized change of state or a transitional state resulting in a voltage spike and/or a current spike at one point in an integrated circuit. By definition, a spurious event is unpredictable or practically so. Spurious logic events can have different origins.

A spurious logic event is, for example,. induced by the impact of an energetic charged particle at one point of an integrated circuit. Such a spurious event is known as a 'Single Event Upset' or SEU. This type of spurious event appears in integrated circuits employed for applications in space, because of the radiation encountered outside of the protecting atmospheric and magnetospheric layers of the earth. This type of spurious event also occurs more and more frequently in integrated circuits for terrestrial applications, especially for the highest integration level technologies, such as 0.25 micron, 0.18 micron and 0.12 micron technologies and below.

A spurious logic event may also be induced by localized capacitive coupling between two layers of the same integrated circuit. This case is often referred to as a "glitch."

Whatever its origin, a spurious event generally results in a voltage and/or a current spike on a digital or analog signal at an affected point in a circuit formed by the point of impact of the energetic particle, in the case of a spurious event of the SEU type.

If the equivalent capacitance of the circuit downstream of the affected point is denoted C, the voltage variation $\Delta V$ at the affected point being considered can be written $\Delta V = \Delta Q/C$, $\Delta Q$ being the charge variation resulting from the impact. The voltage variation $\Delta V$ is generally of very short duration, much shorter for example than the period of a clock signal controlling the circuit.

A spurious event may, or may not, have serious consequences for the downstream circuit that it affects.

For example, for a downstream circuit only using logic signals, if the voltage variation $\Delta V$ is small enough not to cause a change of state, the interference effect disappears in a reasonably short time, with no consequences for the downstream circuit. This is notably the case when the equivalent downstream capacitance is large or when the charge variation $\Delta Q$ is small.

On the contrary, if the voltage variation $\Delta V$ is larger, and notably if it is large enough to modify the value of a logic signal, then the consequences can be serious.

In particular, in the case of an SRAM memory cell, the voltage variation $\Delta V$ may reach a level such that the logic level stored in a data storage node is modified, together with the complementary logic level, so that the memory cell finds itself in a different stable state from its initial state prior to the arrival of the cause of interference.

Because of the increasing miniaturization of electronic circuits, and in particular of memory cells, the capacitance C of the junctions in which logic information is stored is decreasing, so that the voltage variations generated by the appearance of a spurious logic event often reach the threshold levels beyond which the stored information is modified, even for a small quantity of incident charge. Various methods are currently being used for protecting memory cells against spurious logic events.

In this regard, reference may be made to U.S. Pat. No. 5,570,313, the disclosure of which is hereby incorporated by reference, in which redundant data storage nodes are used for storing information in at least one pair of complementary nodes and in which, in order to restore information stored in one node of a pair to its initial state following a spurious event, the information stored in the other node is used.

This type of technique is effective for protecting a circuit against a localized spurious logic event, but it is ineffective for providing protection against spurious events affecting two complementary data storage nodes.

There is a need in the art to overcome this drawback and to provide a memory cell with improved protection against spurious events.

SUMMARY OF THE INVENTION

Accordingly, an embodiment of the invention comprises a memory cell protected against current or voltage spikes. A group of redundant data storage nodes store information in at least one pair of complementary nodes. The cell further includes means for restoring information to its initial state following a current or voltage spike modifying the information in one of the nodes of the pair, using the information stored in the other node.

According to an embodiment of the invention, the nodes of each pair are implanted on opposite sides from one another within a region of a substrate defining the boundaries of the memory cell.

The separation of the redundant nodes thus prevents a spurious event that alters the information contained in one of the nodes of a pair of redundant nodes from modifying the information stored in the other node, so that the altered information can be restored to its initial state.

According to another feature of the invention, the nodes of each pair of nodes are separated by a distance that is greater than the diameter of an ionized particle capable of generating a voltage spike.

For example, the nodes of each pair are separated from one another by at least 1 micron.

According to another feature of the invention, the nodes of each pair are disposed within wells of opposing conductivity types that define junctions isolating the nodes. The resistance of the memory cell to spurious logic events is thus further improved.

In one embodiment, the memory cell comprises four groups of transistors whose purpose is to control the voltage level of four respective data storage nodes.

For example, each group of transistors comprises a first and a second transistor, the first transistor being an MOS transistor of p type and the second transistor being an MOS transistor of n type, the source and the drain of the first transistor being respectively connected to a power supply voltage and to the drain of the second transistor, the source of the second transistor being connected to earth.

According to this embodiment, the drain of the first transistor and the gate of the second transistor of the first, second and third groups of transistors are connected to the gate and to the drain of the first transistor of the second, third and fourth groups of transistors, respectively.

Furthermore, the gate and the drain of the first transistor of the first group of transistors are connected to the drain of the first transistor and to the gate of the second transistor of the fourth group of transistors, respectively.

Lastly, according to this arrangement, the second transistor of the first and second groups of transistors is disposed within a first well of p type, the second transistor of the third and fourth groups of transistors being disposed within a second well of p type. These p-type wells are separated by a well of n type, within which the first transistors of the first, second, third and fourth groups of transistors are implanted.

In accordance with an embodiment of the invention, a memory cell comprises a pair of true data storage nodes and a pair of false data storage nodes. The true data storage nodes are separated by a distance that is greater than a diameter of an ionized particle capable of generating a current or voltage spike in the cell, and the false data storage nodes are separated by a distance that is greater than a diameter of an ionized particle capable of generating a current or voltage spike in the cell.

In accordance with another embodiment, a memory cell comprises a pair of true data storage nodes at the gate terminals of first and second transistors and a pair of false data storage nodes at the gate terminals of third and fourth transistors. The first and second transistors for the true data storage nodes are implanted in different wells of a first conductivity type, and the third and fourth transistors for the false data storage nodes are implanted in different wells of the first conductivity type.

In accordance with yet another embodiment, an integrated circuit memory comprises a semiconductor substrate including a region for a memory cell. A plurality of transistors are formed in a center area of the region. The memory cell includes first and second transistors associated with a pair of true data storage nodes and third and fourth transistors associated with a pair of false data storage nodes. The first and second transistors are formed in the region on opposite sides of the center area and the third and fourth transistors are formed in the region on opposite sides of the center area.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
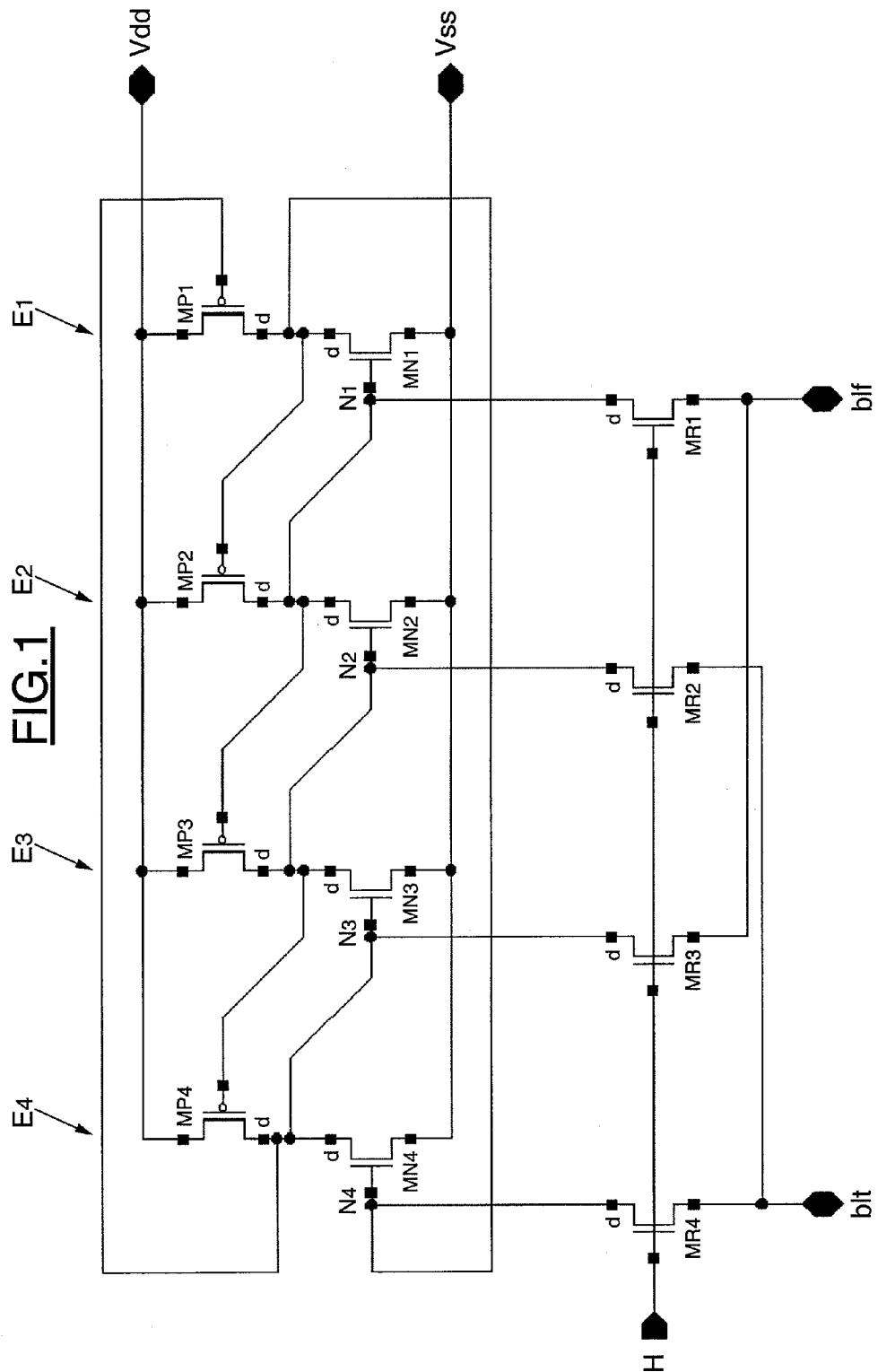
FIG. 1 illustrates an operational block diagram of an SRAM cell.

An example of electronic circuit diagram of an SRAM memory cell protected against current or voltage spikes is shown in FIG. 1. Such a cell is fabricated according to the teachings of U.S. Pat. No. 5,570,313, which has already been mentioned.

As can be seen in FIG. 1, this memory cell comprises four groups of transistors E1, E2, E3 and E4 whose purpose is to control the voltage level of four respective data storage nodes N1, N2, N3 and N4.

Each group of transistors comprises one p-type MOS transistor and one n-type MOS transistor of n type.

Thus, the SRAM memory cell comprises four p-type MOS transistors, namely MP1, MP2, MP3 and MP4, and four n-type MOS transistors, namely MN1, MN2, MN3 and MN4.

The source of each of the transistors MP1, MP2, MP3 and MP4 is connected to a DC voltage source Vdd, for example equal to 1.2 volts, and the source of the transistors MN1, MN2, MN3 and MN4 is connected to an earth/ground connection circuit Vss. The drain d of each p-type MOS transistor of a group i of transistors Ei (i=1, 2, 3, 4) is connected to the drain of the corresponding n-type MOS transistor MNi.

As far as the groups of transistors E1, E2, E3, E4 are concerned, the nodes between the p-transistors and the n-transistors, respectively named N4, N1, N2, N3, are respectively connected to the gates of the p-MOS transistors of the groups E2, E3, E4 and E1 and to the gates of the n-MOS transistors of the groups E4, E1, E2, E3.

As previously indicated, the nodes N1, N2, N3 and N4 used for storing logic information are connected to the gates of the n-type MOS transistors MN1, MN2, MN3 and MN4, respectively.

As can be seen in FIG. 1, the access to these nodes N1, N2, N3 and N4 is effected by means of access transistors MR1, MR2, MR3 and MR4. The purpose of these transistors is for writing data received from BLT and BLF, but also for reading the logic data stored in these nodes, although other read circuits may also be used.

Indeed, the drain d of each of the transistors MR1, MR2, MR3 and MR4 is connected to the gate of the transistors MN1, MN2, MN3 and MN4. The source of the transistors MR1, MR2, MR3 and MR4 receives data inputs from BLT and BLF.

The input BLT is connected to the source of the transistors MR2 and MR4, while the input BLF is connected to the source of the transistors MR1 and MR3. The clock signal H supplies the gate of these access transistors MR1, MR2, MR3 and MR4.

This arrangement allows, on the one hand, the same data BLT to be written in the nodes N2 and N4, and on the other, the same data BLF to be written in the nodes N1 and N3.

The operational principle of this memory cell protected against spurious current and/or voltage events will now be illustrated in the light of an example of interference events, formed by an ionic impact caused at the junction of the transistor MN1, that is large enough to bring about a modification of the stored information. For example, the "1", "0", "1" and "0" data are respectively stored in the nodes N1, N2, N3 and N4. If an interference event appears on the node N1 that results in a transient negative voltage spike, the consequent voltage drop on the gate of the transistor MN1 causes this transistor to turn off. On the contrary, this interference event causes the p-type MOS transistor MP3 to start conducting. However, the voltage at the node N2 is held at zero by the transistor MN3. The transistor MP4 is therefore maintained in a conducting state, so that the transistor MP1 remains off and the voltage on the node N4 is unaltered. Similarly, the logic level stored in the node N3 is not modified.

In parallel, the logic level of the node N1 is restored by means of the transistor MP2.

The arrangement that has just been described allows a logic level stored in a node to be restored following interference generated by a spurious event. The storage of information in redundant data storage nodes also allows this information to be recovered as long as only one of the two nodes is affected. Indeed, if a spurious event manages to simultaneously affect the two nodes N1 and N3, on the one hand, and N2 and N4, on the other, then the information recovered becomes erroneous.

Figure 2:
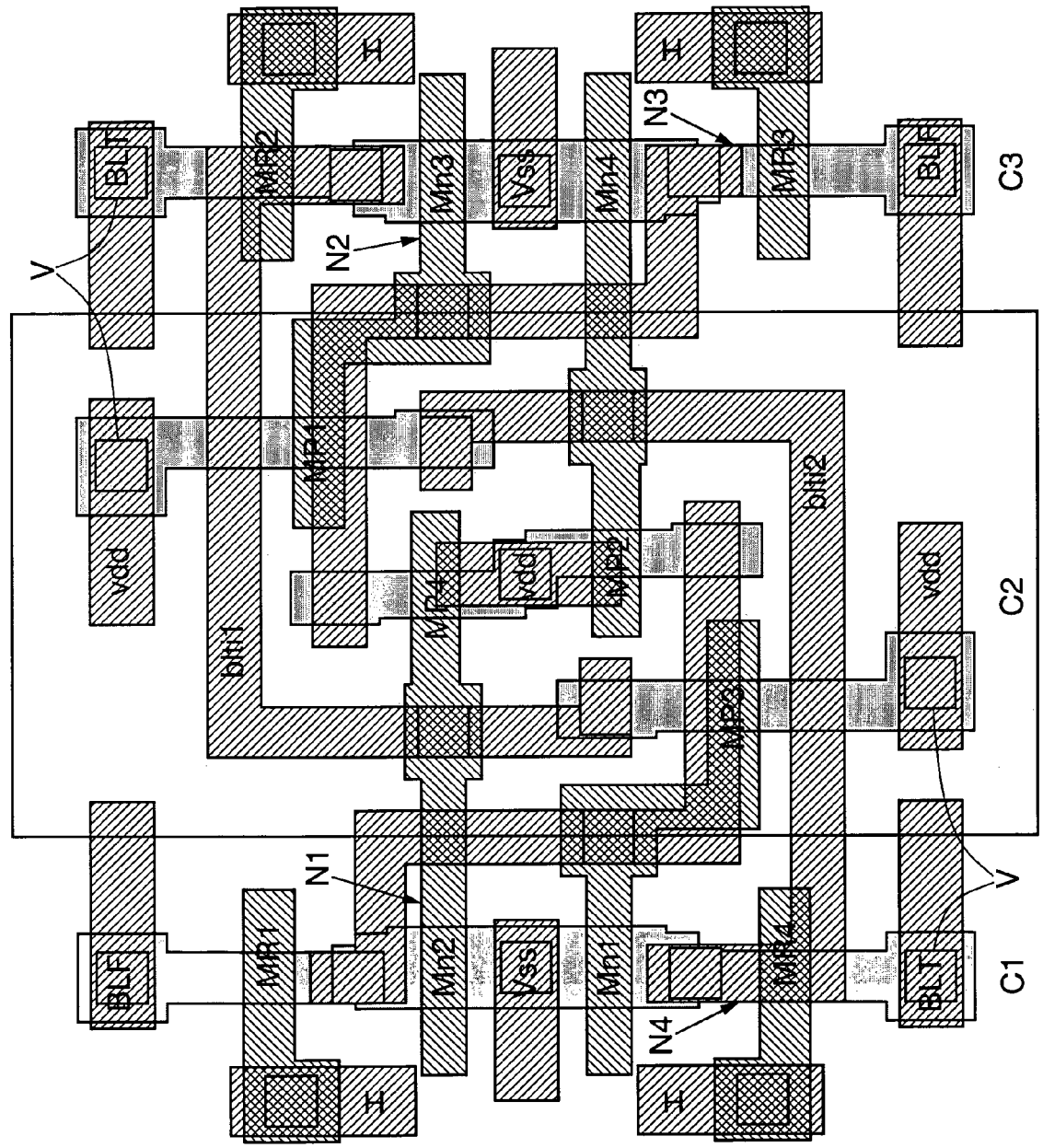
FIG. 2 illustrates a physical embodiment, according to the invention, of the SRAM cell in FIG. 1 that improves its protection against spurious events.

FIG. 2 shows an exemplary embodiment that prevents the possibility of a spurious event simultaneously altering two complementary nodes of a pair of nodes, in which information is redundantly stored.

The embodiment shown in FIG. 2 corresponds to the electronic circuit diagram of the cell in FIG. 1.

FIG. 2 shows the layers of a material that is deposited on a semiconductor substrate in order to form the various elements of the circuit in FIG. 1. The technique for fabricating these elements is available to those skilled in the art and hence will not be described in detail in the following.

It will, however, be noted that the various transistors used to form the memory cell are formed within three isolated wells, namely a first p-type well C1 or "p-well", a second n type well C2 or "n-well", and a third p-type well C3 or "p-well".

As can be seen in FIG. 2, the access transistors MR1 and MR4, together with the n type MOS transistors MN1 and MN2, are disposed within the first well C1. Similarly, the access transistors MR2 and MR3, together with the n type MOS transistors MN3 and MN4, are formed within the third p-type well C3. Finally, the p type MOS transistors MP1, MP2, MP3 and MP4 are fabricated within the central n-type well C2.

Thus, as is apparent from the above, the MOS transistors of n type are each formed within a p-well well, whereas the MOS transistors of p type are formed within a well of n type.

As can be seen in FIG. 2, the bit lines BLF and BLT are respectively connected, on the one hand, to the sources of the transistors MR1 and MR3, and on the other, to the sources of the transistors MR2 and MR4, respectively. The clock signal H is connected to the gates of the access transistors MR1, MR2, MR3 and MR4 by means of suitable conducting layers. It can also be seen in this FIG. 2 that the sources of the transistors MP1, MP2, MP3 and MP4 are connected to a DC power supply source Vdd.

As is known, these various connections are effected using appropriately placed conducting layers, connected to vias such as V.

In the embodiment according to the invention, the transistor MN1 and the transistor MN2, on the one hand, and the transistors MN3 and MN4, on the other, are placed within wells C1 and C3 which are distinct from one another and whose junctions ensure isolation between these transistors. In addition, within each well, the transistors MN1 and MN2, together with the transistors MN3 and MN4, are arranged such that the transistor MN1 is placed on the opposite side from the transistor MN3 and such that the transistor MN2 is also placed on the opposite side from the transistor MN4 in the region of the substrate where the memory cell is implanted, so that the transistor MN1 is as far as possible from the transistor MN3 and that the transistor MN2 is also as far as possible from the transistor MN4. For example, these transistors are thus separated by a distance that is at least equal to 1 micron, so that an ionized particle, whose diameter is typically around 0.6 microns, that affects one of these transistors is prevented from also affecting the other transistor, although shorter distances could also be envisaged.

Similarly, the node N1 is situated as far as possible from the node N3, and the node N2 is also as far as possible from the node N4.

Thanks to this arrangement, the possibility of an ionized particle simultaneously affecting the nodes N1 and N3, on the one hand, and the nodes N2 and N4, on the other, is avoided.

Furthermore, thanks to the formation of the transistors MN1 and MN2, on the one hand, and the transistors MN3 and MN4, on the other, within two p-type wells separated by an n-type well in which the p-type transistors are implanted, the isolation of each pair of redundant data storage nodes is achieved.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory cell protected against current or voltage spikes, comprising:
   a group of redundant data storage nodes for the storage of information comprising at least a first pair of complementary nodes and a second pair of complementary nodes; and
   a circuit that restores information to its initial state following a current or voltage spike modifying the information in one of the complementary nodes using the information stored in another one of the complementary nodes;
   wherein the complementary nodes of the first pair are associated with first and second same channel type connected transistors implanted within a first well of a first conductivity type and wherein the complementary nodes of the second pair are associated with third and fourth same channel type connected transistors implanted within a second well of the same first conductivity type, and wherein the first and second wells are located on opposite sides from one another within a region of a substrate defining the boundary of a single memory cell.

2. The memory cell according to claim 1, wherein corresponding nodes of each pair of complementary nodes are separated by a distance that is greater than one micron.

3. The memory cell according to claim 1, further comprising a well of a second conductivity type opposite the first conductivity type positioned between the separated wells of the first conductivity type and within the boundary of the single memory cell so as to define junctions isolating the two pairs of complementary nodes from each other.

4. A memory cell protected against current or voltage spikes, comprising:
   a group of redundant data storage nodes for the storage of information in a single memory cell comprising at least a first pair of complementary nodes and a second pair of complementary nodes; and
   a circuit that restores information in the single memory cell to its initial state following a current or voltage spike modifying the information in one of the complementary nodes using the information stored in another one of the complementary nodes, wherein the means for restoring comprises four groups of transistors whose purpose is to control the voltage level of four respective nodes in the group of redundant data storage nodes; and
   wherein a first pair of same channel type connected transistors associated with the first pair of complementary nodes are implanted in a first well of a first conductivity type and a second pair of same channel type connected transistors associated with the second pair of complementary nodes are implanted in a second well, separate from the first well, also of the first conductivity type.

5. The memory cell according to claim 4, wherein a group of transistors is associated with each redundant data storage node, each group of transistors comprises a first and a second transistor, the first transistor being an MOS transistor of p type and the second transistor being an MOS transistor of n type, the source and the drain of the first transistor being respectively connected to a power supply voltage and to the drain of the second transistor, the source of the second transistor being connected to ground.

6. The memory cell according to claim 5, wherein the gate and the drain of the first transistor of one of the group of transistors are connected to the drain of the first transistor and to the gate of the second transistor of another of the group of transistors, respectively.

7. The memory cell according to claim 5, wherein the drain of the first transistor and the gate of the second transistor of one of the groups of transistors are connected to the gate and to the drain of the first transistor of another of the groups of transistors, respectively.

8. The memory cell according to claim 7, wherein the gate and the drain of the first transistor of the one group of transistors are connected to the drain of the first transistor and to the gate of the second transistor of the another group of transistors, respectively.

9. The memory cell according to claim 5, wherein the second transistors of a first and second groups of transistors are disposed within the first well of p type conductivity and in that the second transistors of a third and fourth groups of transistors are disposed within the second well of p type conductivity, the first and second p-type conductivity wells being separated by a well of n type within which the first transistors of the groups of transistors are implanted.

10. The memory cell according to claim 2 wherein the group of redundant data storage nodes comprise a true data storage node in each pair and a false data storage node in each pair, and wherein the true data storage nodes in the two pairs are separated by the distance, and further wherein the false data storage nodes in the two pairs are separated by the distance.

11. The memory cell according to claim 1 wherein the first and third transistors providing true nodes have a distance of separation that is greater than one micron and the second and fourth transistors providing false nodes have a distance of separation that is greater than one micron.

12. A memory cell protected against current or voltage spikes, comprising:
a group of redundant data storage nodes for the storage of information in at least a first and second pair of complementary nodes provided for a single memory cell, wherein the group of redundant data storage nodes comprise a pair of true data storage nodes at the gate terminals of first and second transistors and a pair of false data storage nodes at the gate terminals of third and fourth transistors, the first through fourth transistors being of a same channel type; and
a circuit that restores information to its initial state following a current or voltage spike modifying the information in one of the complementary nodes using the information stored in another one of the complementary nodes;
wherein the first and second transistors for the true data storage nodes are implanted in different wells of a first conductivity type, and
wherein the third and fourth transistors for the false data storage nodes are implanted in different wells of the first conductivity type, the first and third transistors being in one well of the first conductivity type and the second and fourth transistors being in another well of the first conductivity type; and
wherein the different wells are on opposite sides from one another within a region of a substrate defining the boundary of the single memory cell.

13. The memory cell according to claim 12 wherein the first and third transistors are implanted in a first well of the first conductivity type and the second and fourth transistors are implanted in a second well of the first conductivity type, the cell further including at least one additional transistor implanted in a well of a second conductivity type, wherein the well of the second conductivity type is positioned in the substrate between the first and second wells of the first conductivity type.

14. A memory cell protected against current or voltage spikes, comprising:
a group of redundant data storage nodes for the storage of information in at least a first and second pair of complementary nodes for a single memory cell, wherein the group of redundant data storage nodes comprise first and second transistors associated with a pair of true data storage nodes and third and fourth transistors associated with a pair of false data storage nodes, the first through fourth transistors being of a same channel type; and
a circuit that restores information to its initial state following a current or voltage spike modifying the information in one of the complementary nodes using the information stored in another one of the complementary nodes;
wherein the nodes of each pair are on opposite sides from one another within a region of a substrate defining the boundary of the single memory cell; and
wherein the first and second transistors are formed in the region in two different wells on opposite sides of a center area within the boundary and wherein the third and fourth transistors are formed in the region in the two different wells on opposite sides of the center area.

15. The memory cell according to claim 14 wherein the first and third transistors are formed in a first well of a first conductivity type and the second and fourth transistors are formed in a second well also of the first conductivity type, and wherein the center area comprises a well of a second conductivity type in which additional transistors are implanted, those additional transistors being connected to the first through fourth transistors.

16. The memory cell according to claim 15 wherein the first conductivity type is p-type and the second conductivity type is n-type.

17. The memory cell according to claim 14 wherein the first and third transistors for the pair of true data storage nodes are separated by a distance of at least 1 micron.

18. The memory cell according to claim 14 wherein the second and fourth transistors for the pair of false data storage nodes are separated by a distance of at least 1 micron.

* * * * *